US006984990B2

(12) United States Patent
Shin

(10) Patent No.: US 6,984,990 B2
(45) Date of Patent: Jan. 10, 2006

(54) APPARATUS FOR DETECTING CONNECTION STATE BETWEEN STEREO EARPHONE PLUG AND CORRESPONDING JACK OF MOBILE COMMUNICATION TERMINAL

(75) Inventor: Ok-Jo Shin, Suwon-shi (KR)

(73) Assignee: Samsung Electronics Co., Ltd., (KR)

( * ) Notice: Subject to any disclaimer, the term of this patent is extended or adjusted under 35 U.S.C. 154(b) by 134 days.

(21) Appl. No.: 10/648,491

(22) Filed: Aug. 25, 2003

(65) Prior Publication Data

US 2004/0100275 A1 May 27, 2004

(30) Foreign Application Priority Data

Aug. 24, 2002 (KR) ...................... 10-2002-0050355

(51) Int. Cl.
*G01R 19/00* (2006.01)
*G08B 13/12* (2006.01)

(52) U.S. Cl. ...................... 324/538; 324/66; 340/568.4

(58) Field of Classification Search ................ 324/538, 324/66; 381/74, 80, 81, 309; 340/568.2, 340/568.4, 687, 7.29
See application file for complete search history.

(56) References Cited

U.S. PATENT DOCUMENTS 6,069,960 A * 5/2000 Mizukami et al. ............ 381/74

* cited by examiner

*Primary Examiner*—Vincent Q. Nguyen
(74) *Attorney, Agent, or Firm*—Dilworth & Barrese, LLP

(57) ABSTRACT

Apparatus for detecting connection state between stereo earphone plug and corresponding jack of mobile communication terminal. The apparatus includes an earphone jack having two terminals which are disconnected from each other only when an earphone plug is inserted into the jack; a switching unit connected to one of the two terminals, and driven only when the two terminals are connected to each other; a comparator connected to the switching unit, for generating a first state signal when the switching unit is driven, and generating a second state signal when the switching unit is not driven; and a controller for receiving the first or second state signal from the comparator, and determining whether the earphone plug is connected to the jack according to the first or second state signal.

6 Claims, 3 Drawing Sheets

APPARATUS FOR DETECTING CONNECTION STATE BETWEEN STEREO EARPHONE PLUG AND CORRESPONDING JACK OF MOBILE COMMUNICATION TERMINAL

PRIORITY

This application claims priority to an application entitled "APPARATUS FOR DETECTING CONNECTION STATE BETWEEN STEREO EARPHONE PLUG AND CORRESPONDING JACK OF MOBILE COMMUNICATION TERMINAL", filed in the Korean Intellectual Property Office on Aug. 24, 2002 and assigned Serial No. 2002-50355, the contents of which are hereby incorporated by reference.

BACKGROUND OF THE INVENTION

1. Field of the Invention

The present invention relates to an apparatus for detecting a connection state between an earphone plug and a corresponding jack of a mobile communication terminal, and more particularly to an apparatus for detecting a connection state between a stereo earphone plug and a corresponding jack of a mobile communication terminal.

2. Description of the Related Art

Various methods for detecting a connection state between an earphone plug and a corresponding jack of a GSM mobile terminal are well known in the art. However, with the development of audio/video technology, the need for reproducing moving images has been rapidly increasing in recent times. Thus, stereo reproduction needs to be readily performed by such a mobile communication terminal.

FIG. 1 illustrates a block diagram of a general mobile communication terminal. Referring to FIG. 1, a mobile communication terminal includes a RF (Radio Frequency) signal processor 100, an IF (Intermediate Frequency) signal processor 102, a controller 104, a storage unit 106, a display 108, an input unit 110, and a voice processor 112, which is connected to a microphone and speaker. An apparatus for detecting a connection state between an earphone plug and a corresponding jack of a mobile communication terminal is positioned in the voice processor 112. The voice processor 112 transmits a signal for indicating a connection state between the earphone plug and the corresponding jack to the controller 104. The controller 104 outputs an acoustic signal to an earphone according to the signal received from the voice processor 112.

FIG. 2 illustrates a schematic diagram of a conventional apparatus for detecting a connection state between an earphone plug and a corresponding jack 200 of a mobile communication terminal. Referring to FIG. 2, the apparatus shifts a level of a signal entered into the controller 104 using a microphone bias and a comparator 210 in order to determine whether an earphone plug is connected to a corresponding jack of a mobile communication terminal. But, this method has a disadvantage in that it is available for only a mono signal. In other words, the above method is applicable to a mobile communication terminal whereby a voltage difference exists between an output voltage of a microphone's positive terminal (+) and the other output voltage of a microphone's negative terminal (−). Earphone jacks can be divided into a mono type as shown in FIG. 2 and a stereo type as shown in FIG. 3. Table 1, below, shows the terminal layouts of conventional mono and stereo earphone jacks corresponding to conventional mono and stereo earphone plugs, respectively.

TABLE 1

| | MONO | STEREO |
|---|---|---|
| Terminal 1 | MIC− | SPEAKER-LEFT |
| Terminal 2 | MIC+ | MIC |
| Terminal 3 | Plug Inserting Detection | Plug Inserting Detection |
| Terminal 4 | X | X |
| Terminal 5 | SPEAKER | SPEAKER-RIGHT |
| Terminal 6 | GROUND | GROUND |

As shown in Table 1, a mono earphone jack has polarized terminals MIC+ (positive terminal) and MIC− (negative terminal), which create the voltage difference that the conventional apparatus uses to detect a connection state of a mono earphone plug. However, the stereo earphone jack has only an unpolarized MIC terminal. Therefore, if a user wants to implement a stereo mode in his or her mobile communication terminal, it is impossible for the above method to detect a connection state between a stereo earphone plug and a corresponding jack of such a mobile communication terminal because a stereo audio signal is a one side ended signal.

SUMMARY OF THE INVENTION

Therefore, it is an object of the present invention to provide an apparatus for detecting a stereo signal without increasing the number of earphone jack terminals in a conventional apparatus for detecting a connection state between an earphone plug and a corresponding jack of a mobile terminal.

In accordance with the present invention, the above and other objects can be accomplished by the provision of an apparatus for detecting a connection state between a stereo earphone plug and a corresponding jack of a mobile communication terminal including: an earphone jack having two terminals which are disconnected from each other when an earphone plug is inserted into the jack; a switching unit connected to one of the two terminals, and driven when the two terminals are connected to each other; a comparator connected to the switching unit, for generating a first state signal when the switching unit is driven, and generating a second state signal when the switching unit is not driven; and a controller for receiving the first or second state signal from the comparator, and determining whether the earphone plug is connected to the jack according to the first or second state signal.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
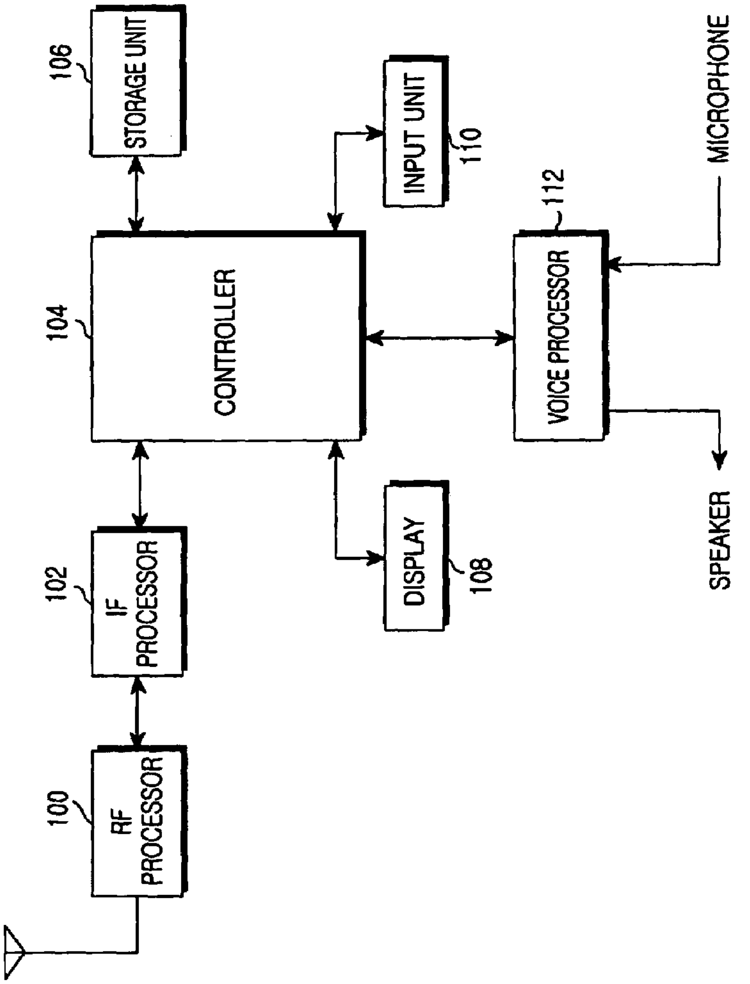
FIG.1 (PRIOR ART)
FIG. 1 illustrates a block diagram of a general mobile communication terminal.
Figure 2:
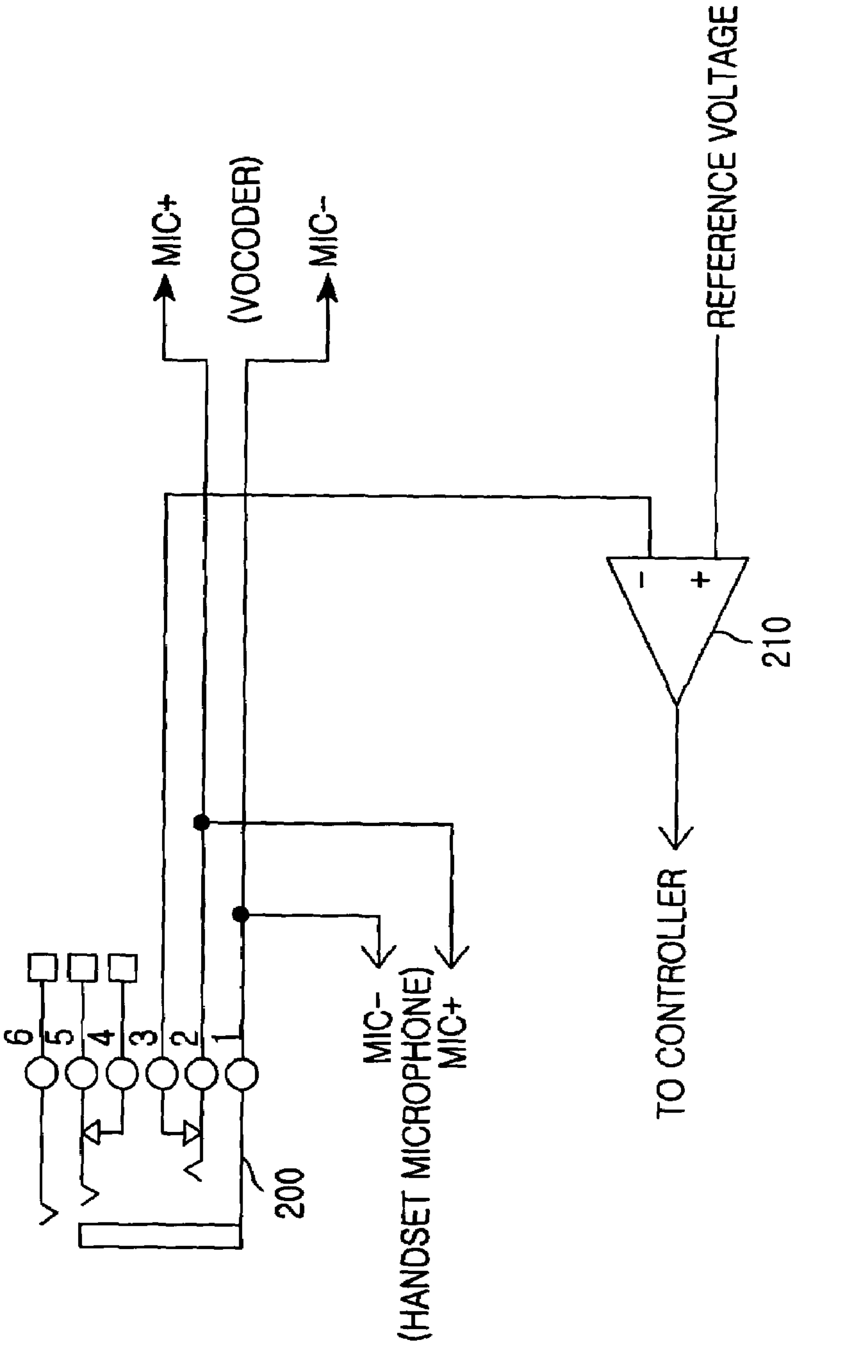
FIG.2 (PRIOR ART)
FIG. 2 illustrates a schematic diagram of a conventional apparatus for detecting a connection state between an earphone plug and a corresponding jack of a mobile communication terminal.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention unclear.

An apparatus for detecting a connection state between an earphone plug and a corresponding jack of a mobile communication terminal in accordance with a preferred embodiment of the present invention is applicable to the mobile communication terminal shown in FIG. 1. Referring to FIG. 1, the apparatus is positioned in voice processor 112. Voice processor 112 transmits a signal for indicating a connection state between an earphone plug and a corresponding jack of a mobile communication terminal to controller 104. Controller 104 outputs an acoustic signal to an earphone according to the signal received from voice processor 112.

Figure 3:
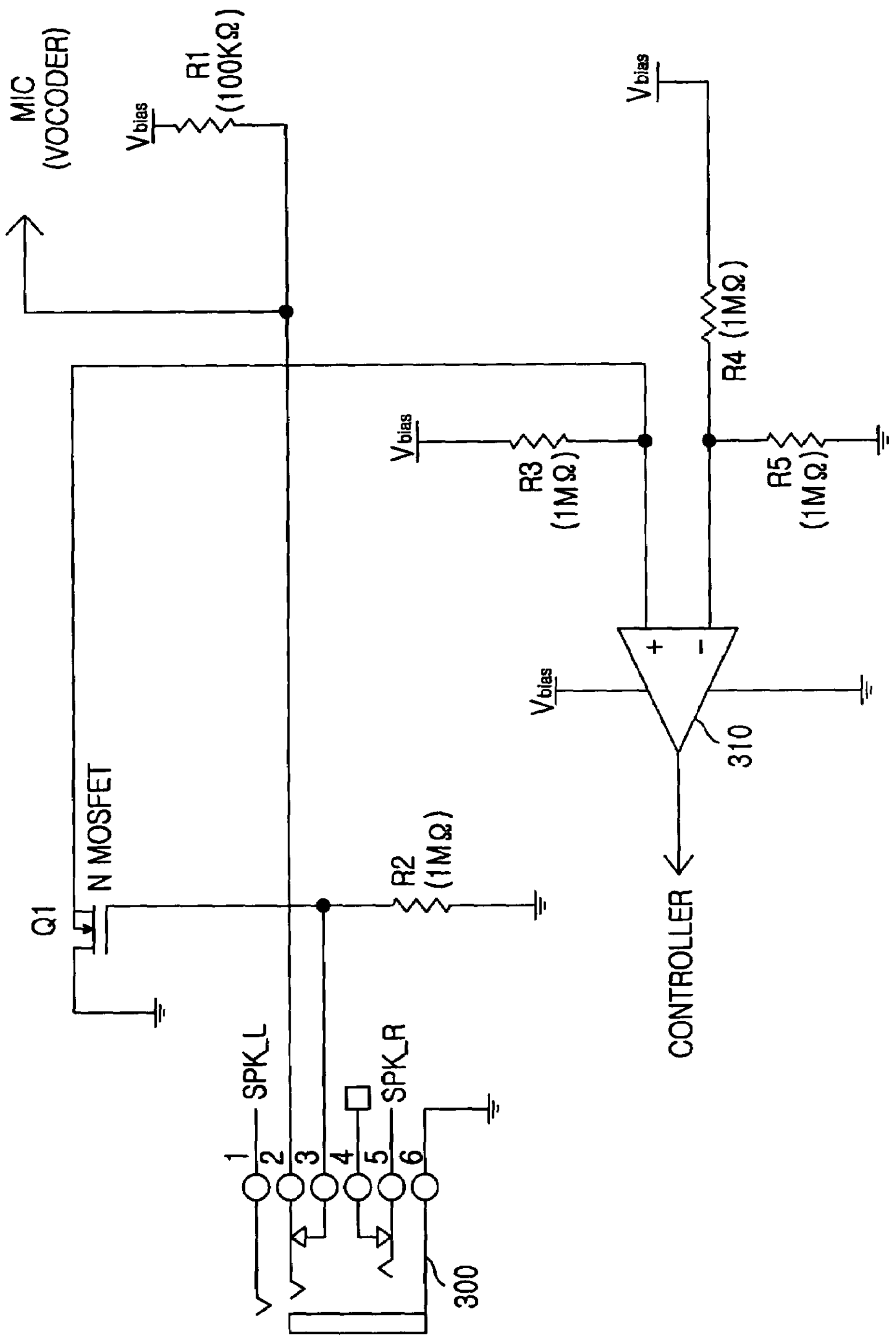
FIG. 3 illustrates a schematic diagram of an apparatus for detecting a connection state between an earphone plug and a corresponding jack of a mobile communication terminal in accordance with a preferred embodiment of the present invention.

FIG. 3 illustrates a schematic diagram of an apparatus for detecting a connection state between an earphone plug and a corresponding jack of a mobile communication terminal in accordance with a preferred embodiment of the present invention.

Referring to FIG. 3, the apparatus includes a four-pole stereo earphone jack 300 for use with an external earphone plug, a comparator 310 for transmitting a detected signal to the controller 104, a plurality of resistors R1~R5, and an NMOSFET (NMOS Field Effect Transistor) Q1 for performing a switching operation.

Operation of the apparatus shown in FIG. 3 will hereinafter be described in the following description.

Firstly, provided that an earphone plug is not connected to a corresponding jack 300 of a mobile communication terminal, the apparatus operates as follows.

Resistors R4 and R5 distribute voltage. More particularly, referring to FIG. 3, the resistors R4 and R5 are used to apply a voltage to the negative terminal (−) of comparator 310, both when NMOSFET Q1 is turned on, and when NMOSFET Q1 is turned off. The applied voltage equals the voltage received by the positive terminal (+) of comparator 310 when NMOSFET Q1 is turned off, multiplied by ½.

In the case where the earphone plug is not inserted into the jack 300, second and third terminals 2~3 of the jack 300 are connected to each other such that the NMOSFET Q1 is turned on by a pull-up resistor R1. Since a positive terminal (+) of comparator 310 is connected to a ground terminal through Q1, the comparator 310 generates a first state signal, for example, a logic low signal. That is, voice processor 112, shown in FIG. 1, transmits the logic low signal generated from the comparator 310 to the controller 104. Upon receiving the logic low signal from the voice processor 112, the controller 104 determines that the earphone plug is not connected to the jack 300.

Secondly, provided that the earphone plug is connected to the jack 300, the apparatus operates as follows.

In the case where the earphone plug is inserted into the jack 300, second and third terminals 2~3 of the jack 300 are disconnected from each other such that the NMOSFET Q1 is turned off by a pull-down resistor R2. As a result, the comparator 310 generates a second state signal, for example, a logic high signal, by a pull-up resistor R3. That is, voice processor 112 shown in FIG. 1 transmits the logic high signal generated from the comparator 310 to the controller 104. Upon receiving the logic high signal from voice processor 112, the controller 104 determines that the earphone plug is connected to the jack 300. Then, the controller 104 recognizing the connection state between the earphone plug and the jack 300 may generate a signal via the jack 300.

Thirdly, provided that the earphone plug in such a connection state is released (i.e., disconnected) from the jack 300, the apparatus operates as follows.

In the case where the earphone plug is released from the jack 300, second and third terminals 2~3 of the jack 300 are connected again to each other such that the NMOSFET Q1 is turned on by the pull-up resistor R1. Since the positive terminal (+) of the comparator 310 is connected to a ground terminal, the comparator 310 generates a logic low signal. That is, the voice processor 112 shown in FIG. 1 transmits the logic low signal generated from the comparator 310 to the controller 104. Upon receiving the logic low signal from the voice processor 112, the controller 104 determines that the earphone plug is not connected to the jack 300.

As apparent from the above description, the apparatus using the NMOSFET according to the present invention detects a connection state between a stereo earphone plug and a corresponding jack of a mobile communication terminal without increasing the number of the jack's terminals.

Also, the apparatus makes a stereo earphone plug and a corresponding jack available for a mobile communication terminal, detects a connection signal between the earphone plug and the corresponding jack while maintaining the number of conventional four-pole terminals, and is applicable even to a single ended signal differently from the conventional apparatus applicable to a double ended signal only.

Although preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for detecting a connection state between a stereo earphone plug and a corresponding jack of a mobile communication terminal, comprising:

- an earphone jack having two terminals which are disconnected from each other when an earphone plug is inserted into the jack;
- a switching unit connected to one of the two terminals, and driven when the two terminals are connected to each other;
- a comparator connected to the switching unit, for generating a first state signal when the switching unit is driven, and generating a second state signal when the switching unit is not driven; and
- a controller for receiving the first or second state signal from the comparator, and determining whether the earphone plug is connected to the earphone jack according to the first or second state signal.

2. The apparatus as set forth in claim 1, wherein the switching unit is an NMOSFET (NMOS Field Effect Transistor) which is turned on when the two terminals are connected to each other, and which thereby connects a non-inverting terminal of the comparator to a ground terminal.

3. The apparatus as set forth in claim 2, wherein the NMOSFET is turned on by a pull-up resistor when the earphone plug is not connected to the jack, said pull-up resistor connected to a first terminal of the two terminals, and said first terminal not connected to the NMOSFET.

4. The apparatus as set forth in claim 2, wherein the NMOSFET is turned off by a pull-down resistor when the earphone plug is connected to the jack, said pull-down resistor connected to the NMOSFET.

5. The apparatus as set forth in claim 3, wherein when the NMOSFET is turned on, the controller receives the first state signal and determines that the earphone plug is not connected to the earphone jack.

6. The apparatus as set forth in claim 4, wherein when the NMOSFET is turned off, the controller receives the second state signal and determines that the earphone plug is connected to the earphone jack.

* * * * *